(12) United States Patent
Takada

(10) Patent No.: US 11,474,652 B2
(45) Date of Patent: Oct. 18, 2022

(54) DISPLAY DEVICE INCLUDING BUTTON, BAR, AND VOLUME SENSORS

(71) Applicant: Japan Display Inc., Minato-ku (JP)

(72) Inventor: Naoki Takada, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/988,816

(22) Filed: Aug. 10, 2020

(65) Prior Publication Data

US 2020/0371619 A1 Nov. 26, 2020

Related U.S. Application Data

(63) Continuation of application No. 16/122,411, filed on Sep. 5, 2018, now Pat. No. 10,775,944.

(30) Foreign Application Priority Data

Sep. 5, 2017 (JP) .............................. JP2017-170537

(51) Int. Cl.
*G06F 3/041* (2006.01)
*G06F 3/044* (2006.01)
(Continued)

(52) U.S. Cl.
CPC .......... *G06F 3/0445* (2019.05); *G02F 1/1343* (2013.01); *G06F 3/044* (2013.01);
(Continued)

(58) Field of Classification Search
CPC ...... G06F 3/041; G06F 3/0412; G06F 3/0416; G06F 3/04166; G06F 3/0418; G06F 2203/0339; G02F 1/1343; G02F 1/1339; G02F 1/13338; G02F 1/136286; G02F 2201/123

See application file for complete search history.

(56) References Cited

U.S. PATENT DOCUMENTS 6,172,948 B1 1/2001 Keller
2007/0291013 A1 12/2007 Won
(Continued)

FOREIGN PATENT DOCUMENTS

JP 2010-176297 8/2010
JP 2011-204136 A 10/2011
JP 2014-510319 A 4/2014

OTHER PUBLICATIONS

Japanese Office Action dated Jun. 1, 2012 in Japanese Patent Application No. 2017-170537 (submitting unedited computer generated English translation only), 5 pages.

*Primary Examiner* — Ryan A Lubit
(74) *Attorney, Agent, or Firm* — Maier & Maier, PLLC

(57) ABSTRACT

According to one embodiment, a display device includes a display panel, a cover member includes an opening which opposes the display panel and a sensor device provided around the opening in the cover member, and the sensor device includes a button portion includes a plurality of first sensors arranged at a first interval along a first direction, a bar portion includes plurality of second sensors arranged at a second interval along the first direction, the second sensors being smaller than the first sensors and a volume portion formed into a ring shape and including a plurality of third sensors arranged along a circumferential direction thereof.

5 Claims, 13 Drawing Sheets

(51) Int. Cl.
  *G02F 1/1343* (2006.01)
  *H01L 27/32* (2006.01)
  *H05K 1/18* (2006.01)
(52) U.S. Cl.
  CPC .......... *G06F 3/0412* (2013.01); *G06F 3/0416* (2013.01); *G06F 3/0446* (2019.05); *H01L 27/3276* (2013.01); *H05K 1/18* (2013.01); *G02F 2201/123* (2013.01); *G06F 2203/0339* (2013.01); *G06F 2203/04107* (2013.01); *G06F 2203/04108* (2013.01); *G06F 2203/04111* (2013.01)

(56) References Cited

U.S. PATENT DOCUMENTS

| | | | |
|---|---|---|---|
| 2009/0058707 A1 | 3/2009 | Craze | |
| 2009/0174682 A1 | 7/2009 | Bowden | |
| 2010/0058251 A1* | 3/2010 | Rottler | G06F 3/0488 |
| | | | 715/863 |
| 2011/0003550 A1 | 1/2011 | Klinghult | |
| 2012/0260164 A1 | 10/2012 | Scheufler | |
| 2013/0120312 A1* | 5/2013 | Takahashi | G06F 3/0443 |
| | | | 345/174 |
| 2014/0036428 A1 | 2/2014 | Leong et al. | |
| 2014/0078049 A1* | 3/2014 | Parshionikar | G06V 40/176 |
| | | | 345/156 |
| 2017/0228037 A1 | 8/2017 | Gouiliou | |
| 2018/0129330 A1* | 5/2018 | Ding | G06F 3/0443 |
| 2018/0341363 A1* | 11/2018 | Wang | G06F 3/0447 |
| 2019/0012007 A1* | 1/2019 | Kim | G06V 10/147 |
| 2019/0286281 A1* | 9/2019 | Aoki | G06F 3/041 |

\* cited by examiner

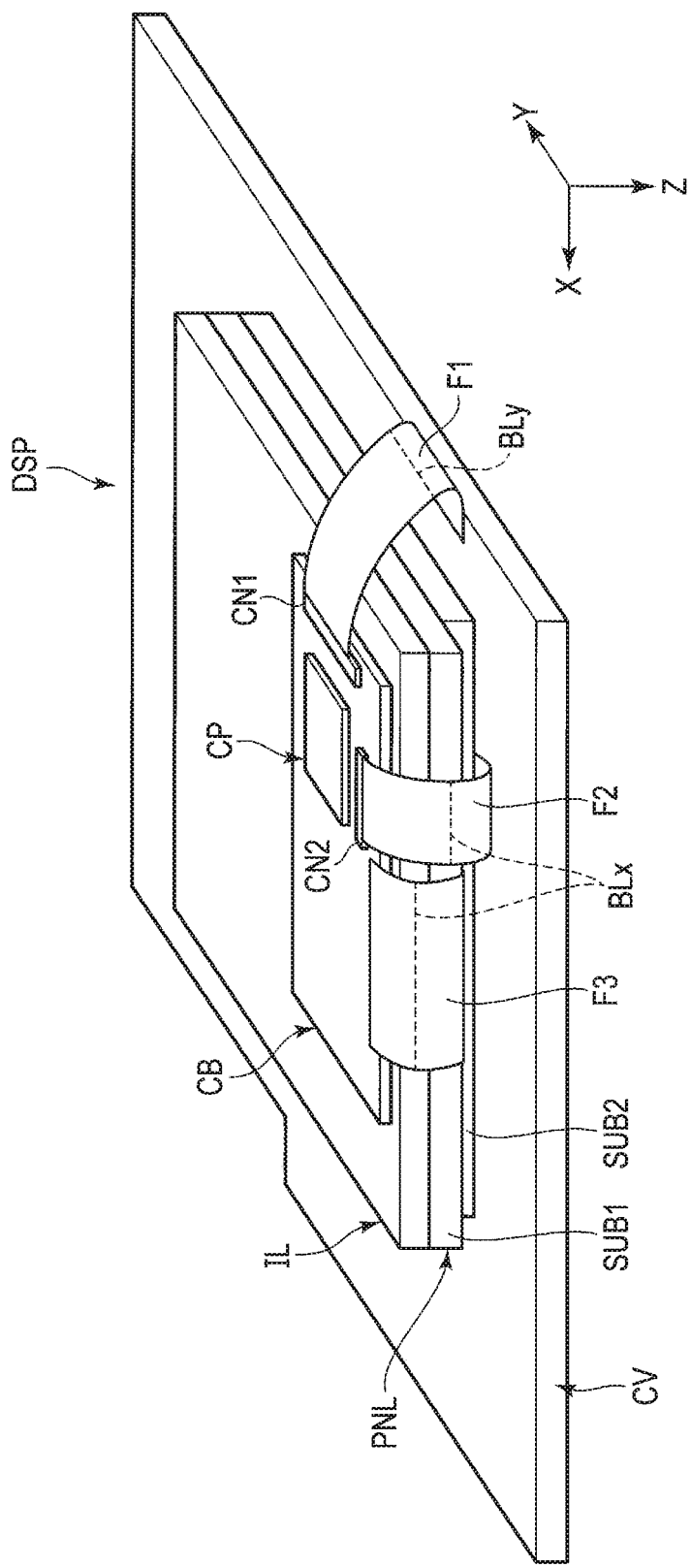
F I G. 2

DISPLAY DEVICE INCLUDING BUTTON, BAR, AND VOLUME SENSORS

CROSS-REFERENCE TO RELATED APPLICATIONS

This application is a continuation Application of U.S. application Ser. No. 16/122,411, filed Sep. 5, 2018, which is based upon and claims the benefit of priority from Japanese Patent Application No. 2017-170537, filed Sep. 5, 2017, the entire contents of which are incorporated herein by reference.

FIELD

Embodiments described herein relate generally to a display device and a sensor device.

BACKGROUND

Recently, as an interface of display devices or the like, sensors configured to detect contacting or approaching of an object such as a finger have been put into practical use. As an example of such sensors, a touch panel including a pair of frame electrodes provided on an outer side of a data entry area, to detect the coordinates of an entry point has been disclosed.

Incidentally, when a plurality of displays and/or control switches need to be installed in a limited space such as a cockpit, in some cases, it is difficult to arrange them therein, which may cause degradation of operability.

BRIEF DESCRIPTION OF THE DRAWINGS

FIG. 2 is a perspective view showing a connection structure on. a rear surface side of the display device DSP shown in FIG. 1.

DETAILED DESCRIPTION

Figure 1:
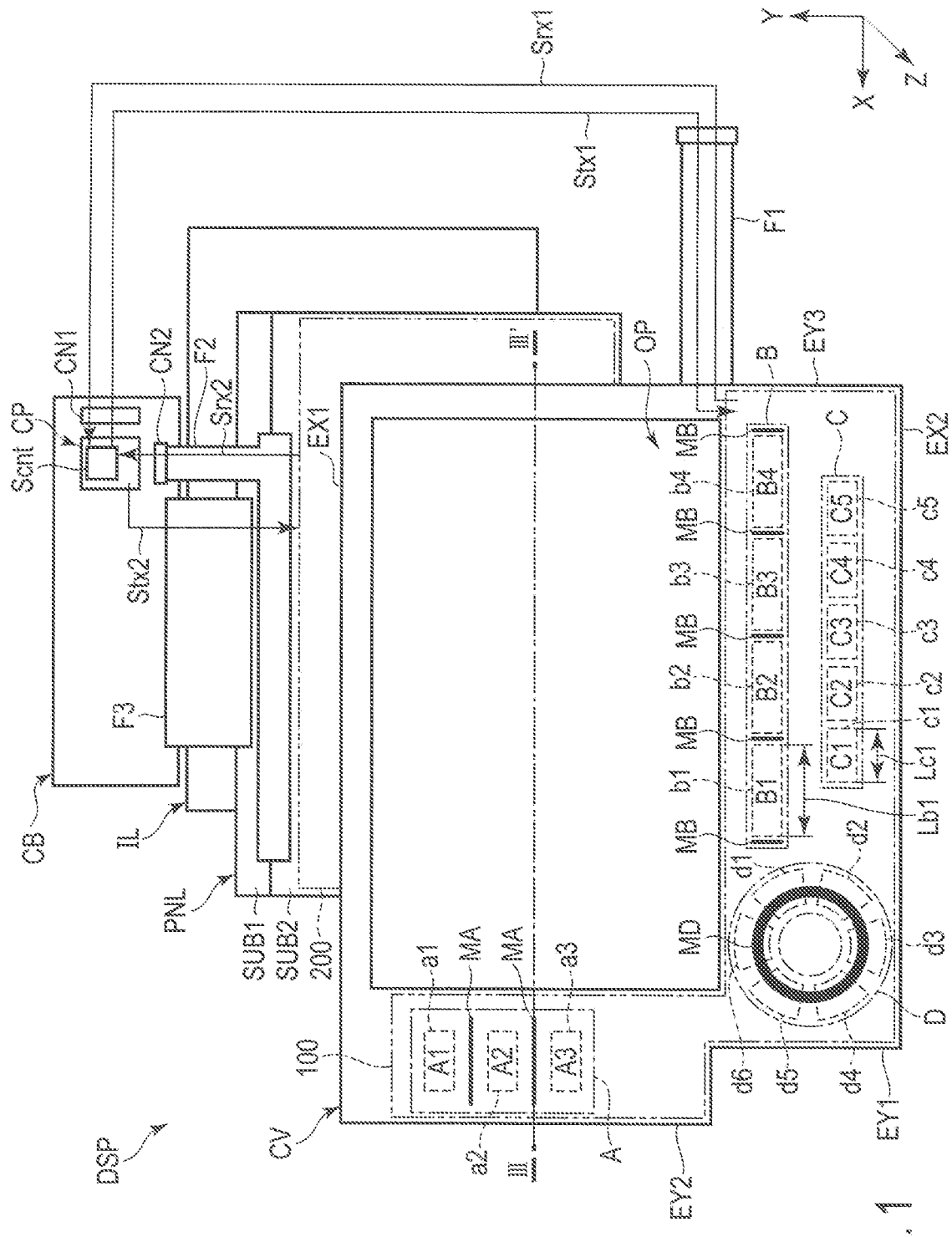
FIG. 1 is a perspective view showing a configuration example of a display device DSP of an embodiment.

In general, according to one embodiment, a display device comprises a display panel, a cover member comprising an opening which opposes the display panel and a sensor device provided around the opening in the cover member, and the sensor device comprises a button portion comprising a plurality of first sensors arranged at a first interval along a first direction, a bar portion comprising plurality of second sensors arranged at a second interval along the first direction, the second sensors being smaller than the first sensors, and a volume portion formed into a ring shape and comprising a plurality of third sensors arranged along a circumferential direction thereof.

According to another embodiment, a display device comprises a display panel, a cover member comprising an opening which opposes the display panel, a first sensor device provide around the opening in the cover member and a second sensor device provided in the display panel and superimposed on the opening, and the first sensor device comprises a shield wiring line at a ground potential, provided along the opening.

According to another embodiment, a sensor device comprises a base material comprising a first surface and a second surface on an opposite side to the first surface, a volume portion located on a side of the first surface, formed into a ring-like shape and comprising a plurality of sensors arranged along a circumferential direction thereof, and the base material comprises a groove portion superimposed on the plurality of sensors in the second surface.

According to another embodiment, a sensor device comprises an annular drive electrode and a plurality of detection electrodes located on an outer side of the drive electrode on a same plane as that of the drive electrode and arranged at intervals along an entire circumference of the drive electrode, and the sensor detects contacting or approaching of an object in a circular sensor area based on electrostatic capacitance between the drive electrode and the plurality of detection electrodes.

According to another embodiment, a display device comprises a cover member comprising an opening, a wiring board, a display panel located between the cover member and the wiring board and opposing the opening, a first sensor device provided around the opening in the cover member, a second sensor device provided on the display panel, a first flexible wiring board which electrically connects the first sensor device and the wiring board to each other, a second flexible wiring board which electrically connects the second sensor device and the wiring board to each other and a sensor controller provided on the wiring board, which controls the first sensor device and the second sensor device.

The embodiment will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

FIG. 1 is a plan view showing a configuration example of a display device DSP of the embodiment. In the figure, a first direction X and a second direction Y are directions crossing each other, and a third direction Z is a direction crossing the first direction X and the second direction Y. While the first direction X, the second direction Y and the third direction Z are orthogonal to each other, they may cross each other at an angle other than 90 degrees. In this specification, a direction towards a tip of the arrow which indicates the third direction Z is referred to as up (or simply on) and a direction backwards from the tip of the arrow is referred to as down (or simply under). Further, it is assumed that an observation position at which the display device DSP is to be observed is at the pointing end side of the arrow indicating the third direction Z, and a view toward an X-Y plane defined by the first direction X and the second direction Y is referred to as a plan view.

The display device DSP comprises a cover member CV, a display panel PNL, an illumination device IL, a wiring board CB, a sensor device 100 and a sensor device 200. The illumination device IL, the display panel PNL and the cover member CV are arranged in this order along with the arrow indicating the third direction Z.

The cover member CV includes an opening OP opposing the display panel PNL. In the example illustrated, the opening OP has a rectangular shape with long sides along in the first direction X and short sides along the second direction Y. The shape of the opening OP is not limited to that of the example, but may be polygonal other than rectangular, circular, elliptical, etc.

The cover member CV is formed from, for example, a seamless glass base material. The cover member CV comprises edges EX1 and EX2 along the first direction X, and edges EY1 to EY3 along the second direction Y. The edge EX2 is located on an opposite side to the edge EX1 while interposing the opening OP therebetween, so as to be separated from the opening OP than from the EX1. The edge EY1 and EY2 are located on an opposite side to the edge EY3 while interposing the opening OP therebetween. The edge EY2 is separated from the opening OP than from the edge EY1.

In the example illustrated, the cover member CV is formed into a flat plate substantially parallel to the X-Y plane defined by the first direction X and the second direction Y, but it may be a curved surface formed by bus lines along the first direction X or the second direction Y.

The sensor device 100 is formed in a circumference of the opening OP on the cover member CV. FIG. 1 shows a surface side of the cover member CV. The surface of the cover member CV faces the user and touchable by the user. The sensor device 100 is located on a rear surface side of the cover member CV, that is, on a side opposing the display panel PNL, a detailed illustration of which is omitted. The cover member CV as such may be referred to as a cover glass, a style strip, a sensor panel, a console panel or the like.

The sensor device 100 comprises a side button portion A, a bottom button portion B, a bar portion C, and the volume portion D. The side button portion. A comprises a plurality of sensors a1 to a3 arranged at intervals along the second direction Y. The bottom button portion B comprises a plurality of sensors b1 to b4 arranged at intervals along the first direction X. The bar portion C is a series of belt-like sensor areas extending along the first direction X, and comprises a plurality of sensors c1 to c5 arranged at intervals along the first direction X. The volume portion D is formed into a ring-like sensor area and comprises a plurality of sensors d1 to d6 arranged along a circumferential direction thereof. These sensors a1 to a3, the sensors b1 to b4, the sensors c1 to c5, and the sensors d1 to d6 are, for example, of a capacitance type and configured to detect contacting or approaching of an object such as a user's finger with respect to the cover member CV based on a change in the electrostatic capacitance between a pair of electrodes opposing each other.

In the example illustrated, the side button portion A is located between the edge EY2 and the opening OP. Moreover, the bottom button portion B, the bar portion C and the volume portion D are located between the edge EX2 and the opening OP.

The sensors a1 to a3 and the sensors b1 to b4 each function as, for example, a switch for selecting a respective corresponding application. At positions superimposed on the sensors a1 to a3, titles of applications "A1", "A2", and "A3" are formed respectively. Similarly, at positions superimposed on the sensors b1 to b4, titles of applications "B1", "B-2", "B3" and "B4" are formed respectively. In this specification, the term "superimposition" is meant not only such a state that two members are in contact with each other but also that two members are separated from each other with an air layer or some other member is interposed between the two members.

The titles of the applications corresponds to various types of applications, for example, a car-navigation system, an audiovisual control system, an air-conditioning control system, a traffic information receiving system, an in-vehicle camera imaging system, and a voice communication. Various applications are executed by application software built in an external application processor.

In the side button portion A, a mark MA is formed to indicate each of a position between the sensor a1 and the sensor a2 and a position between the sensor a2 and the sensor a3. The sensors a1 to a3 have an identical size. In the bottom button portion B, marks MB are formed to partition the sensors b1 to b4 respectively from each other. The sensors b1 to b4 have an identical size.

The sensors c1 to c5 each function as, for example, an operation switch for selecting the operation to be executed in the respective application. At positions superimposed on the sensors c1 to c5, titles of the operations or operation symbols "C1", "C2", "C3", "C4", and "C5" are formed respectively.

Not marks are formed between adjacent pairs of the sensors in the bar portion C. The sensors c1 to c5 have an identical size. The sensor c1 is smaller than the sensor b1. For example, the sensor b1 has a length Lb1 along the first direction X, whereas the sensor c1 has a length Lc1 shorter than the length Lb1, along the first direction X. Moreover, a gap Dc between the sensors c1 and c2 along the first direction X is less than a gap Db between the sensors b1 and b2 along the first direction X.

The sensors d1 to d6 each function as, for example, a control switch for adjusting the volume in an applications such as the audiovisual control system. In another example, the sensors d1 to d6 can be each used also as a control switch such as for tone control, tuning and the like.

In the volume portion D, a circular mark MD is formed to be superimposed on the sensors d1 to d6. Note that the mark MD is not limited to a circular shape, but may be formed in some other shape such as dots along a circumference.

In the cover member CV, the user can visually identify the application titles "A1" to "A3", the application titles "B1" to "B4", the operation symbols "C1" to "C5" and the marks MA, MB and MD. On the other hand, the sensors indicated by dotted lines and the sensor device 100 indicated by alternate long and short dash lines are illustrated merely for explanation and cannot be viewed by the user.

The number of the sensors of the sensor device 100 and the layout of the sensors are not limited to those of the example illustrated.

The display panel PNL is, for example, a liquid crystal display panel and comprises a pair of substrates SUB1 and SUB2. As a display device, the display panel PNL may be a display panel comprising an organic electroluminescence element, an electrophoresis element or the like. The sensor device 200 is provided in the display panel PNL. The sensor device 200 is configured to detect the contacting or approaching of an object with respect to the opening OP superimposed on the display panel PNL. The details of the display panel PNL and the sensor device 200 will be described later.

The wiring board CB comprises connectors CN1 and CN2.

A flexible wiring board F1 electrically connects the sensor device 100 and the wiring board CB to each other. That is, the flexible wiring board F1 is connected by its one end side to a rear surface side of the cover member CV along the edge EY3, and extends along the first direction X. Another end side of the flexible wiring board F1 is connected to the connector CN1.

The flexible wiring boards F2 and F3 electrically connect the sensor device 200 and the wiring board CB to each other. That is, the flexible wiring board F2 is connected by its one end side to the substrate SUB2, and the other end side is connected to the connector CN2. The flexible wiring board F3 is connected by its one end side to the substrate SUB1 and the other end side is connected to the wiring board CB.

A sensor controller Sent is formed on a wiring board CB. In the example illustrated, the sensor controller Sent are built in a single IC chip CP. The IC chip CF is electrically connected to each of the connectors CN1 and CN2. The sensor controller Scnt controls the sensor devices 100 and 200. More specifically, the sensor controller Scnt transmits a sensor drive signal Stx1 to the sensor device 100 to drive each sensor and receives a detection signal Srx1 from each sensor. Similarly, the sensor controller Scnt transmits a sensor drive signal Stx2 to the sensor device 200 and receives a detection signal Srx2 from each sensor.

In FIG. 1, for example, the sensor device 100 is equivalent to a first sensor device and the sensor device 200 is equivalent to a second sensor device. Each of the sensors b1 to b4 is equivalent to a first sensor, each of the sensors c1 to c5 is equivalent to a second sensor, and each of the sensors d1 to d6 is equivalent to a third sensor. The gap Db is equivalent to a first gap, and the gap Dc is equivalent to a second gap. The connector CN1 is equivalent to a first connector and the connector CN2 is equivalent to a second connector. The flexible wiring board F1 is equivalent to a first flexible wiring board and the flexible wiring board F2 is equivalent to a second flexible wiring board.

According to this embodiment, the sensor device 100 is formed on the circumference of the opening OP opposing the display panel PNL and comprises various sensors such as the side button portion A, the bottom button portion B, the bar portion C, and the volume portion D. These sensors can be each used as a switch for applications. Thus, the various switches are substituted by touch sensors and these touch sensors are integrated as one display device, thereby making it possible to improve operability.

Moreover, when the various switches are integrated in a limited space such as a cockpit, the flexibility of the interior design can be improved.

Further, the sensor controller Scnt which controls the sensor devices 100 and 200 is made common as a single IC chip. With this configuration, the touch detection function with respect to the opening OP superimposed on the display panel PNL and the touch detection function with respect to the various sensors located around the opening OP can be simultaneously controlled.

Here, with the marks MA to MD provided, the positions of the various sensors are visually recognizable by the user even without projections and recesses on the surface of the cover member CV.

FIG. 2 is a perspective view showing the connection structure of the rear surface side of the display device DSP shown in FIG. 1. The flexible wiring boards F2 and F3 are bent by a bending line BLx along the first direction X. Thus, the wiring board CB is arranged on the rear surface back side of the illumination device IL. The display panel PNL and the illumination device IL are located between the cover member CV and the wiring board CB. The flexible wiring board F1 is bent by a bending line BLy along the second direction Y, and is connected to the connector CN1.

Figure 3:
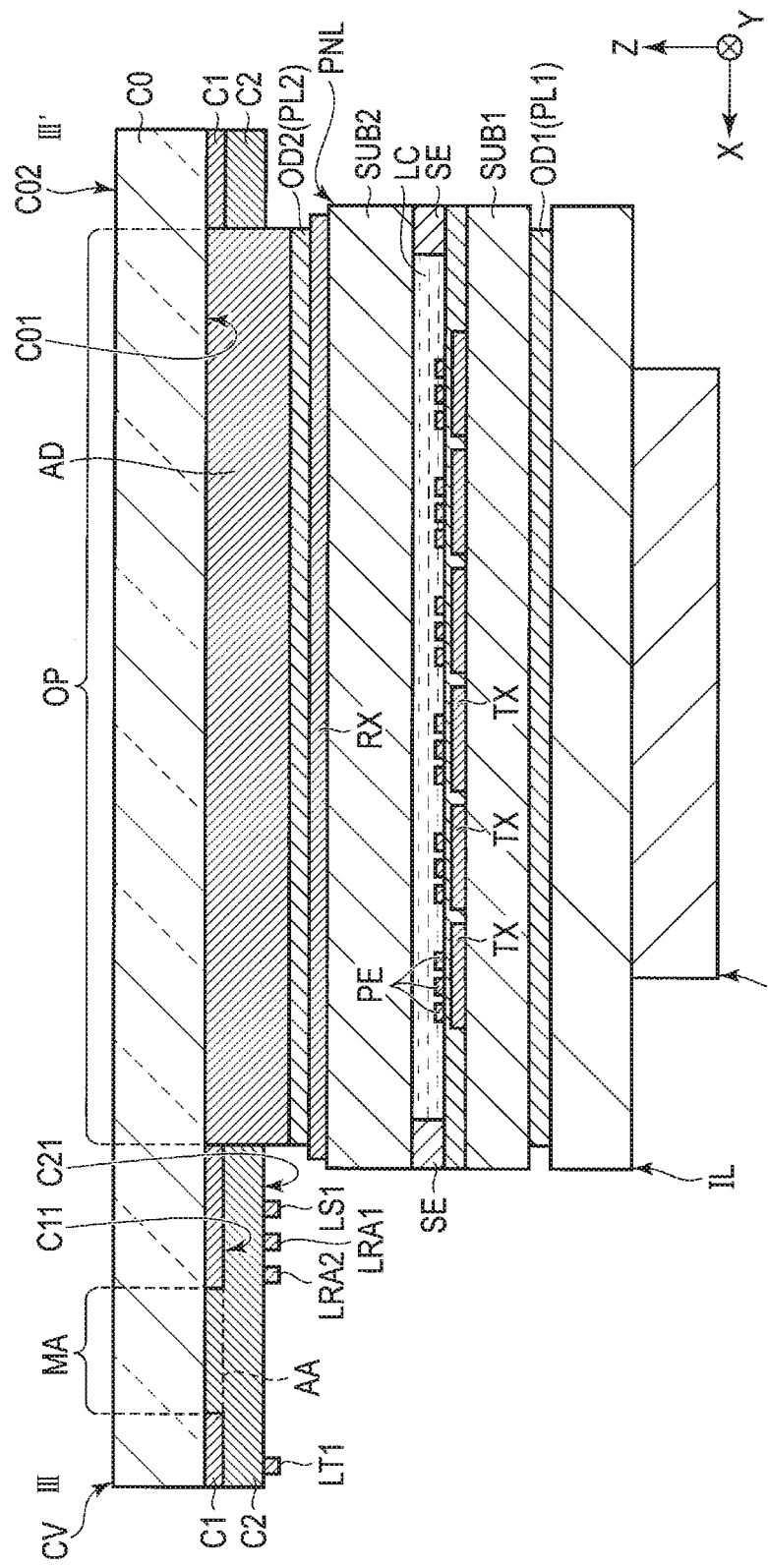
FIG. 3 is a cross section showing a structure including a mark MA of display device DSP taken along line III-III' in FIG. 1.

FIG. 3 is a cross section showing a structure of display device DSP including the marks MA taken along line III-III' line in FIG. 1. The cover member CV comprises a base material C0 and coloring lavers C1 and C2. The base material C0 is, for example, a seamless glass base material as described above. Note that the material is not limited to this, but may be a resin base material. The base material C0 comprises a first surface C01 and a second surface C02 on an opposite side to the first surface C01. The coloring layer C1 is in contact with the first surface C01. The coloring layer C2 overlaps a lower surface C11 of the coloring layer C1. The coloring layers C1 and C2 are of colors different from each other. For example, the coloring layer C1 is black and the coloring layer C2 is white, but the combination of colors is not limited to this. One of them may be transparent. None of the coloring layers C1 and C2 is disposed on the opening OP. The coloring layer C1 comprises a through-hole AA in a position corresponding to a mark MA so as to penetrate to the base material C0. The coloring layer C2 is disposed on the through-hole AA. When the cover member CV is observed from a second surface C02 side, the periphery of the opening OP is recognized as the color of the coloring layer C1 and the mark MA is recognized as the color of the coloring layer C2. The other marks, application titles and operation symbols shown in FIG. 1 are formed in a similar fashion to that of the mark MA, and are recognized sighted as the color of the coloring layer C2.

The sensor device 100 shown in FIG. 1 comprises various wiring lines LS1, LRA1, LRA2, LT1 and the like, which will be described in detail later. The sensor device 100 as such is provided on the lower surface C21 of the coloring layer C2. The coloring layer C2 is formed of an insulating material. Alternatively, since the coloring layer C2 serves as a base of the sensor device 100, it should be preferably formed of a material having a resistance higher than at least that of the coloring layer C1.

The display panel PNL comprises a liquid crystal layer LC between the first substrate SUB1 and the second substrate SUB2. The substrates SUB1 and SUB2 are adhered together with a sealing material SE. The substrate SUB1 comprises drive electrodes Tx and pixel electrodes PE. One drive electrode Tx opposes a plurality of pixel electrodes PE. The substrate SUB2 comprises detection electrodes Rx. The drive electrodes Tx and the detection electrodes Rx are arranged to cross each other in the X-Y plane, for example. For example, the drive electrodes Tx are arranged at intervals therebetween along the first direction X and each extend along the second direction Y. The detection electrodes Rx are arranged at intervals therebetween along the second direction Y, and each extend along the first direction X.

A first optical element OD1 including a polarizer PL1 is located between the substrate SUB1 and the illumination device IL. A first optical element OD1 including a polarizer PL2 is located between the substrate SUB2 and the cover member CV. In the example illustrated, the optical element OD1 is adhered to the substrate SUB1 and the optical element CD2 is adhered to the substrate SUB2.

The display panel PNL is adhered to the cover member CV with a transparent adhesive AD. In the example illustrated, the adhesives AD is in contact with the first surface C01 in the opening OP, and in contact with the touch optical element OD2.

Figure 4:
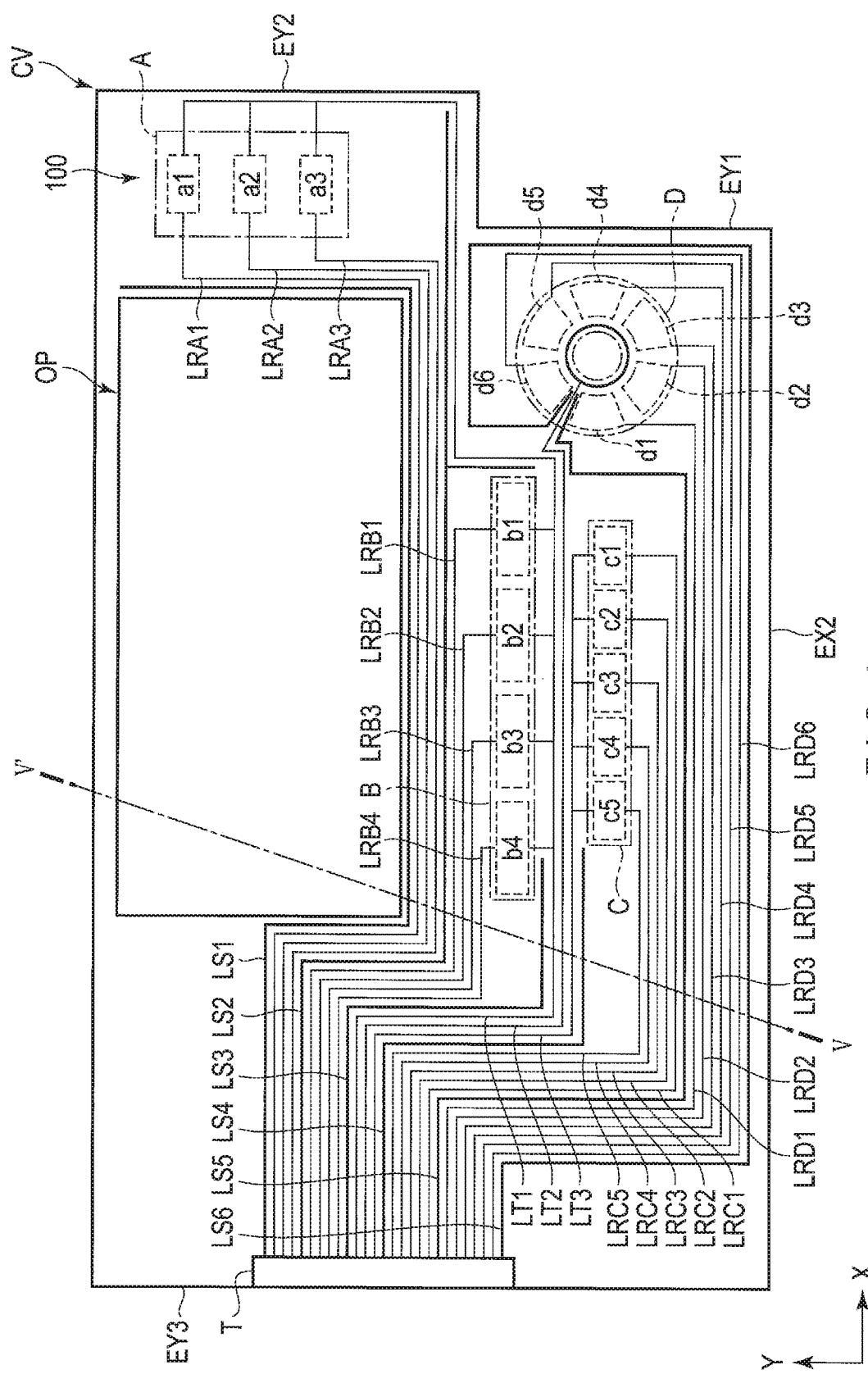
FIG. 4 is a plan view showing a configuration example of a sensor device 100.

FIG. 4 is a plan view showing a configuration example of the sensor device 100. That is, the sensor device 100 comprises drive wiring lines LT1 to LT3, shield wiring lines LS1 to LS6, detection wiring lines LRA1 to LRA3, detection wiring lines LRB1 to LRB4, detection wiring lines LRC1 to LRC5 and detection wiring lines LRD1 to LRD6. These various wiring lines are connected to the terminal portion T disposed along the edge EY3. The terminal portion T is connected to the flexible wiring board F1 shown in FIG. 1.

The drive wiring line LT1 is provided to correspond to the side button portion A and the bottom button portion B, and connected to the sensors a1 to a3 and the sensors b1 to b4. The drive wiring lines LT3 is provided to correspond to the bar portion C and connected to the sensors c1 to c5. The drive wiring line LT2 is provided to correspond to the volume portion D and connected to the sensors d1 to d6. The drive wiring lines LT1 to LT3 are configured to transmit sensor drive signals to the sensors from the sensor controller Scnt shown in FIG. 1. The drive wiring lines for transmitting the same sensor drive signal may be integrated as one. In the example illustrated, the sensor device 100 comprises three drive wiring lines LT1 to LT3. But the number of lines is not limited to that of this example, but may be two or less.

In the sensor device 100, all the drive wiring lines LT1 to LT3 are integrated. In the example illustrated, the drive wiring lines LT1 to LT3 are located between the bottom button portion B and the bar portion C, to extend toward the terminal area T.

The detection wiring lines LRA1 to LRA3 are connected to the sensors a1 to a3, respectively. The detection wiring lines LRB1 to LRB4 are connected to the sensors b1 to b4, respectively. The detection wiring lines LRC1 to LRC5 are connected to the sensors c1 to c5, respectively. The detection wiring lines LRD1 to LRD6 are connected to the sensors d1 to d6, respectively. The detection wiring lines are configured to input the detection signals from the sensors shown in FIG. 1 to the sensor controller Scnt.

The shield wiring lines LS1 to LS6 are all at a ground potential.

The shield wiring line LS1 is provided along the opening OP. In the example illustrated, the shield wiring line LS1 is located between the opening OP and the detection wiring lines LRA1 to LRA3. With this arrangement, when the display panel PNL is disposed on the opening OP, the sensor device 200 formed on the display panel PNL and each of the detection wiring lines LRA1 to LRA3 can be electrically shielded from each other. Therefore, the detection wiring lines LRA1 to LRA3 cannot be easily affected by the electric field from the sensor device 200. Thus, if a region different from that of the sensors a1 to a3 is touched, it is possible to suppress of detection errors by or malfunction of the sensors a1 to a3.

The shield wiring line LS2 is provided between the detection wiring lines LRA1 to LRA3 and the detection wiring lines LRB1 to LRB4. Further, the shield wiring line LS2 is provided also between the detection wiring lines LRA1 to LRA3 and the drive wiring line LT1. Thus, the detection wiring lines LRA1 to LRA3 cannot be easily affected by the electric field from the drive wiring line LT1. Further, the detection wiring lines LRA1 to LRA3 and the detection wiring lines LRB1 to LRB4 cannot be affected by the electric fields from each other.

The shield wiring line LS2 branches off in the middle thereof and provided between the sensor b1 and the drive wiring line LT1. With this arrangement, the sensor b1 cannot be easily affected by the electric field from the drive wiring line LT1.

The shield wiring line LS3 is provided between the detection wiring lines LRB1 to LRB4 and the drive wiring lines LT1 to LT3. The shield wiring line LS4 is provided between the drive wiring lines LT1 to LT3 and the detection wiring lines LRC1 to LRC5. That is, the drive wiring lines LT1 to LT3 are located between the shield wiring line LS3 and the shield wiring line LS4. With this arrangement, the detection wiring lines LRB1 to LRB4 and the detection wiring lines LRC1 to LRC5 cannot be easily affected by the electric fields from the drive wiring lines LT1 to LT3.

The shield wiring line LS5 is provided between the detection wiring lines LRC1 to LRC5 and the detection wiring lines LRD1 to LRD6. The shield wiring line LS5 is provided also between the detection wiring lines LRD1 to LRD6 and the drive wiring line LT2, and further between the sensor d1 and the drive wiring line LT2. With this arrangement, the detection wiring lines LRD1 to LRD6 cannot be affected by the electric field from the drive wiring line LT2. Further, the detection wiring lines LRC1 to LRC5 and the detection wiring lines LRD1 to LRD6 cannot be easily affected by the electric fields from each other.

The shield wiring line LS6 is provided between the detection wiring lines LRD1 to LRD6 and the edges EX2, EY1 and EY2 of the cover member CV. Further, the shield wiring line LS6 is provided also between the drive wiring line LT1 and the detection wiring lines LRD1 to LRD6, and further between the sensor d6 and the drive wiring line LT2. With this arrangement, the detection wiring lines LRD1 to LRD6 cannot be easily affected by the electric field from the drive wiring line LT2. Further, the detection wiring lines LRD1 to LRD6 cannot be easily affected by an external electric field from an outer side of the edge EX2, EY1 and EY2.

The sensors a1 to a3, the sensors b1 to b4 and the sensors c1 to c5 are located between the detection wiring lines connected to these, and the drive wiring lines connected to these. For example, as to the positions of the sensors a1 to a3 with relative to each other, the detection wiring lines LRA1 to LRA3 are located between the shield wiring line LS1 and the sensors a1 to a3. The drive wiring line LT1 is located between the edge EY2 and the sensors a1 to a3. The sensors a1 to a3 are located between the detection wiring lines LRA1 to LRA3 and the drive wiring line LT1. That is, the detection wiring lines and the drive wiring line connected to the sensors are located opposite to each other while interposing the respective sensors therebetween. As compared to the case where the detection wiring lines and the drive wiring lines are located on the same side with respect to the sensors, the detection wiring lines and the drive wiring lines do not approach each other in a region different from that of the sensors. Therefore, when a region different from the sensors is touched, detection errors by or malfunction of the sensors a1 to a3 can be suppressed.

In FIG. 4, for example, the sensor device 100 is equivalent to the first sensor device and the sensor device 200 is equivalent to the second sensor device. Each of the sensors b1 to b4 is equivalent to the first sensor, each of the sensors c1 to c5 is equivalent to the second sensor, and each of the sensors d1 to d6 is equivalent to the third sensor. The drive wiring line LT1 is equivalent to a first drive wiring line, the drive wiring line LT3 is equivalent to a second drive wiring line, and the drive wiring line 112 is equivalent to a third drive wiring line. The shield wiring line LS3 is equivalent to a first shield wiring line, and the shield wiring line LS4 is equivalent to a second shield wiring line. Each of the detection wiring lines LRB1 to LRB4 is equivalent to a first detection wiring line, each of the detection wiring lines LRC1 to LRC5 is equivalent to a second detection wiring line, and each of the detection wiring lines LRD1 to LRD6 is equivalent to a third detection wiring line.

Figure 5:
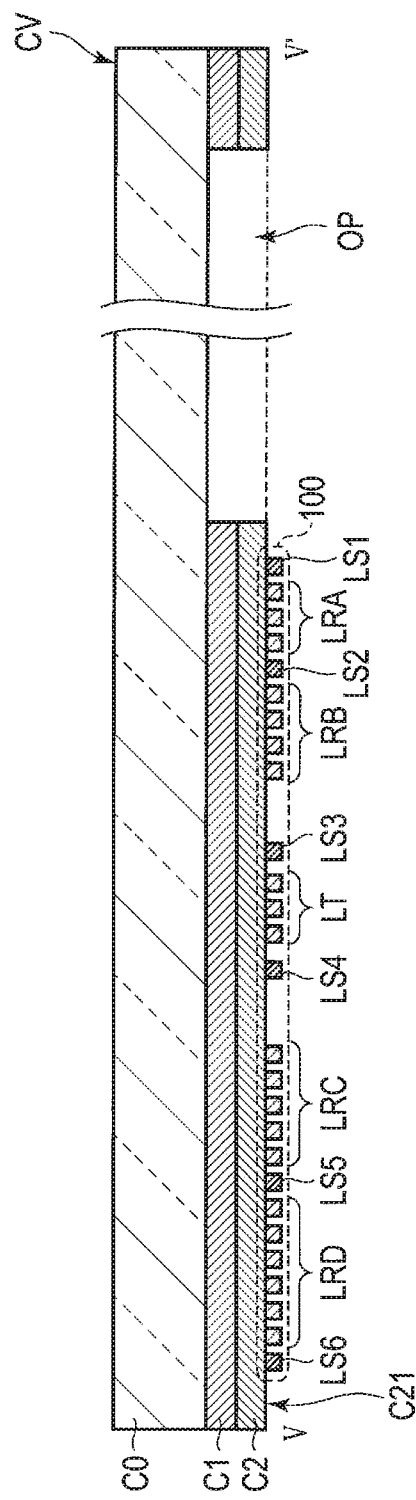
FIG. 5 is a cross section showing a structure of a cover member CV taken along line V-V' in FIG. 4.

FIG. 5 is a cross section showing the structure of the cover member CV taken along line V-V' shown in FIG. 4. The shield wiring lines LS1 to LS6, the drive wiring lines LT, the detection wiring lines LRA, the detection wiring lines LRB, the detection wiring lines LRC, and the detection wiring lines LRD of the sensor device 100 are located on the same surface. In the example illustrated, the sensor device 100 is located on the lower surface C21 of the coloring layer C2. Therefore, the sensor device 100 can be formed of an identical material collectively. For example, the sensor device 100, which includes various wiring lines described above, is formed from an identical material, and here the printing method is applicable as the formation method.

More specifically, a conductive paste containing silver as a conductive material and a resin material as a binder is applied as the material for forming the sensor device 100. The conductive material should preferably be of nano-particles of a nano order in terms of particle diameter, for example, but it is not limited to this. Moreover, the conductive material is not limited to silver, but, gold, platinum, iridium, rhodium, copper, nickel, aluminum, carbon or the like may be applicable as well.

As the formation method of the sensor device 100, the screen printing method is preferable, but it is not limited to this. The gravure printing method, the pad printing method, the ink jet printing method or the like may be applied. Or, the sensor device 100 formed on the flexible wiring board may be adhered to the coloring layer C2.

The shield wiring lines LS1 to LS6, the drive wiring lines LT, the detection wiring lines LRA, the detection wiring lines LRB, the detection wiring lines LRC and the detection wiring lines LRD may be covered by a protective film. The protective film may be either one of an organic insulating material and an inorganic insulating material.

None of the shield wiring lines LS1 to LS6, the drive wiring lines LT, the detection wiring lines LRA, the detection wiring lines LRB, the detection wiring lines LRC, and the detection wiring lines LRD is located in the opening OP. For this reason, it is not necessary to use a transparent material to form these wiring lines, or to form them into a pattern not easily visible by the user. That is, the alternatives of the material to form these wiring lines increase, and even low-resistance materials can be selected. Moreover, when these wiring lines are formed from a low resistance material, the increase in the resistance of each wiring line can be suppressed also in a wiring layout which surrounds the three sides of the opening OP.

The shield wiring lines LS1 to LS6 are located respectively between the drive wiring lines LT and the detection wiring lines LRA, the detection wiring lines LRB, the detection wiring lines LRC and the detection wiring lines LRD, respectively. With this configuration, even if the wiring lines are arranged at narrow pitches, detection errors and malfunction can be controlled as described above.

Figure 6:
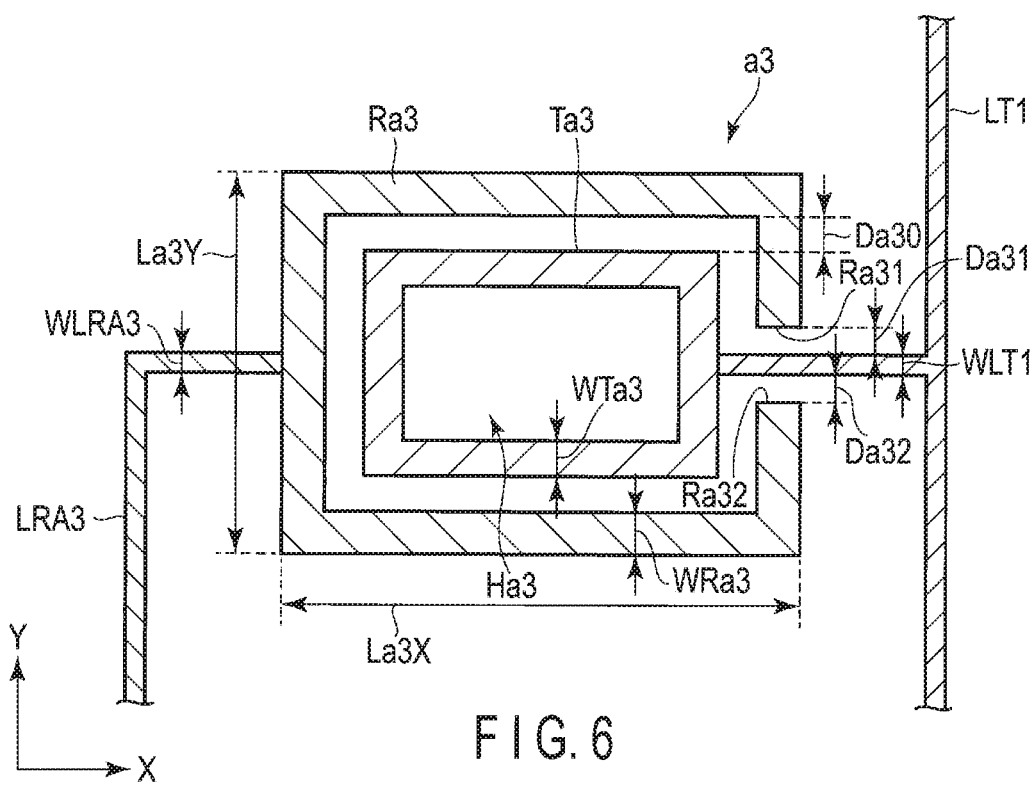
FIG. 6 is a plan view showing a configuration example of a sensor a3.

FIG. 6 is a plan view showing a configuration example of the sensor a3. The sensor a3 comprises a drive electrode Ta3 and a detection electrode Ra3. The detection electrode Ra3 is located on an outer side of the drive electrode Ta3 so as to surround the drive electrode Ta3. The detection electrode Ra3 is formed into approximately a letter "C" shape with one end portion Ra31 and another end portion Ra32 opposing each other with a gap therebetween. The detection electrode Ra3 is connected to the detection wiring line LRA3. The drive electrode Ta3 is connected to the drive wiring line LT1 passing through between the one end portion Ra31 and the other end portion Ra32. The detection electrode Ra3 and the detection wiring line LRA3 are formed integrally as one body. Further, the drive electrode Ta3 and the drive wiring line LT1 are formed integrally as one body. That is, the detection wiring line LRA3 and the drive wiring line LT1 are located on the same plane and located on the lower surface C21 shown an FIG. 5 as the case of the detection electrode Ra3 and the drive electrode Ta3.

The drive electrode Ta3 and the detection electrode Ra3 oppose each other with a preset gap Da30 therebetween within the X-Y plane so that electrostatic capacitance can be formed. therebetween. Note that a gap Da31 between the one end portion Ra31 and the drive wiring line LT1 and a gap Da32 between the other end portion Ra and the drive wiring line LT1 are also equivalent to the gap Da30.

The size of the sensor a3 is defined as outermost dimensions of the drive electrode Ta3 and the detection electrode Ra3. In the example illustrated, the sensor a3 is formed into a rectangular shape extending along the first direction X, and the drive electrode Ta3 and the detection electrode Ra3 are also each formed into a rectangular shape. The size of the sensor a3 is defined by a length La3X of the drive electrode Ta3 along the first direction X and a length La3Y thereof along the second direction Y. For example, the length La3X is 20 mm to 30 mm and the length La3Y is 10 mm to 20 mm. The size of the sensor a3 is determined based on the size of objects to be detected, for example, the user's finger.

The drive electrode Ta3 comprises a hole Ha3 in a central portion thereof, and has a constant width WTa3 over its entire body. The width WTa3 is greater than the width WLT of the drive wiring line LT11. For example, the width WTa3 is about 10 times the width WLT1. The aspect ratio of the hole Ha3 is higher than that of the sensor a3 itself and the hole Ha3 is horizontally longer than the sensor a3.

The detection electrode Ra3 has a constant width WRa3 over its entire body. The width WRa3 is larger than the width WLRA3 of the detection wiring lines LRA3. For example, the width WRa3 is about 10 times the width WLRA3. The width WTa3 of the drive electrode Ta3 is equivalent to the width WRa3 of the detection electrode Ra3. The width WLT1 of the drive wiring line LT1 is equivalent to the width WLRA3 of the detection wiring lines LRA3. The width WTa3 and the width WRa3 are greater than the gap Da30.

The sensors a1 and a2 which constitute the side button portion A are configured by a similar structure to that of the sensor a3.

As described above, the drive electrode Ta3 and the detection electrode Ra3 are located on the same plane, thereby making it possible to form them collectively using an identical material. Thus, the dispersion in the gap Da30 between the drive electrode Ta3 and the detection electrode Ra3 can be suppressed. Moreover, since the dispersion in the electrostatic capacitance between the sensor a3 and the sensor a1 or a2 can be suppressed, the detection accuracies of the sensors a1 to a3 can be equalized.

Moreover, when the detection electrode Ra3 surrounds the drive electrode Ta3, the electrostatic capacitance per sensor can be increased in the sensor a3 of a limited size as compared to that of the state where the detection electrode Ra3 and the drive electrode Ta3 are simply arranged parallel to each other.

Figure 7:
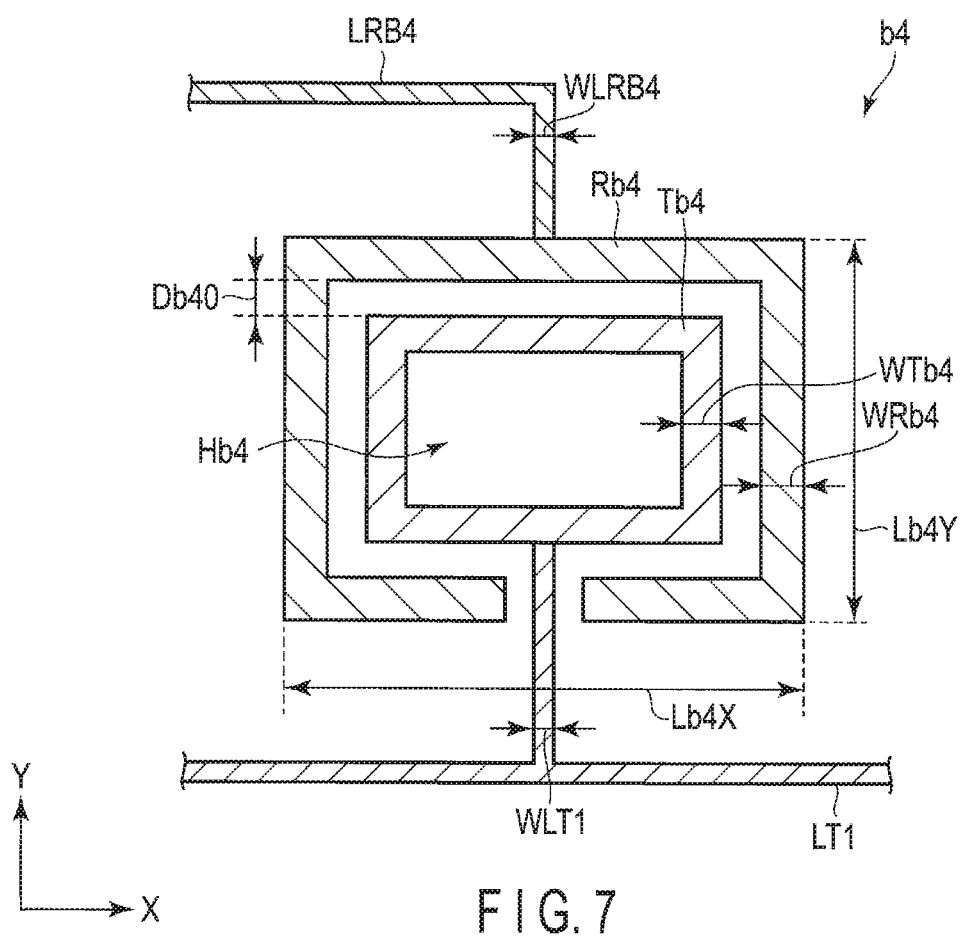
FIG. 7 is a plan view showing a configuration example of a sensor b4.

FIG. 7 is a plan view showing a configuration example of the sensor b4. The sensor b4 is configured with a similar structure to that of the sensor a3, which will be briefly described. The sensor b4 comprises a drive electrode Tb4 and a detection electrode Rb4. The detection electrode Rb4 is connected to the detection wiring lines LRB4. The drive electrode Tb4 is connected to the drive wiring line LT1. The drive electrode Tb4 and the detection. electrode Rb4 oppose each other with a constant gap Db40 therebetween within the X-Y plane.

The size of the sensor b4 is defined by a length Lb4X along the first direction X and a length Lb4Y along the second direction Y. As the sensor a3 and the sensor b4 compared to each other in size, the length Lb4X along the first direction X is greater than the length La3X, and the length Lb4Y along the second direction Y is equivalent to the length La3Y. That is, the sensor b4 has a rectangular shape extending from the sensor a3 in the first direction X.

The drive electrode Tb4 comprises a hole Hb4 in a central portion thereof, and has a constant width WTb4 over its entire body. The width WTb4 is greater than the width WLT1 of the drive wiring line LT1. The detection electrode Rb4 has a constant width WRb4 over its entire body. The width WRb4 is greater than the width WLRB4 of the detection wiring line LRB4. The width WTb4 of the drive electrode Tb4 is equivalent to the width WRb4 of the detection electrode Rb4. The width WLT1 of the drive wiring line LT1 is equivalent to the width WLRB4 of the detection wiring line LRB4. The width WTb4 and the width WRb4 are greater than the gap Db40.

The sensors b1 to b3 which constitute the bottom button portion B are configured in a similar manner to that of the sensor b4.

Figure 8:
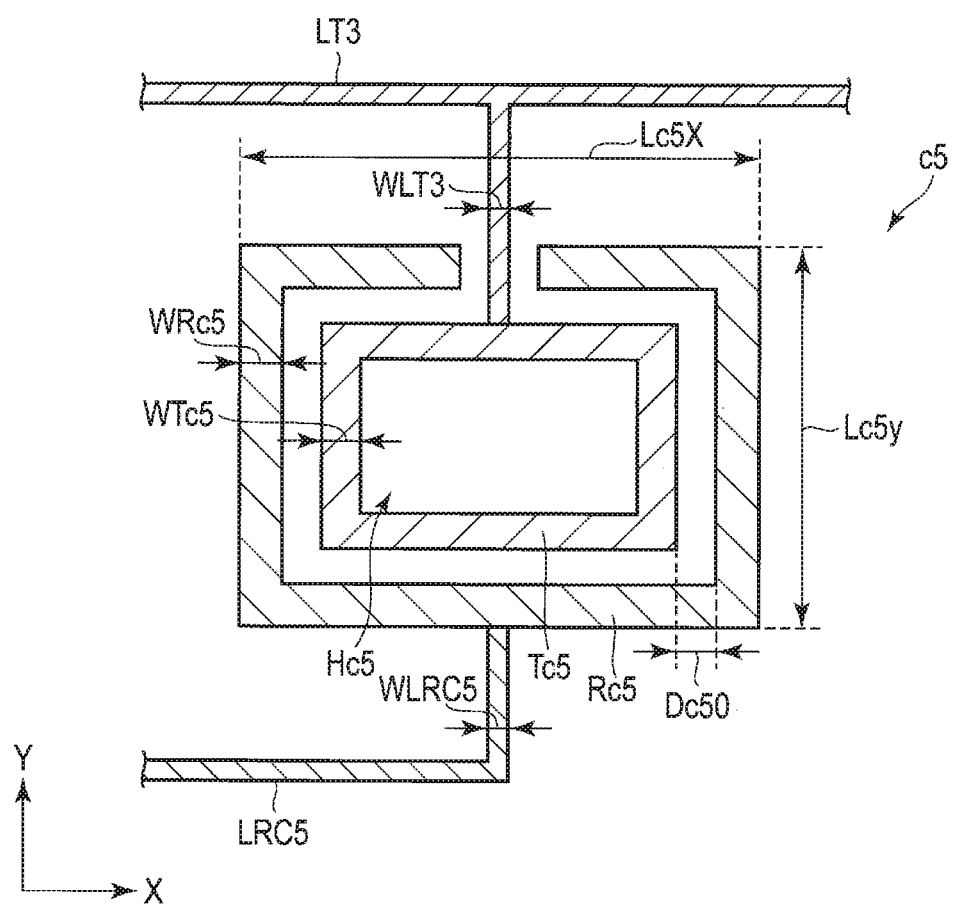
FIG. 8 is a plan view showing a configuration example of a sensor c5.

FIG. 8 is a plan view showing a configuration example of the sensor c5. The sensor c5 is configured with a similar structure to that of the sensor a3, which will be described briefly. The sensor c5 comprises a drive electrode Tc5 and a detection electrode Rc5. The detection electrode Rc5 is connected to the detection wiring line LRC5. The drive electrode Tc5 is connected to the drive wiring line LT3. The drive electrode Tc5 and the detection electrode Rc5 oppose each other with a constant gap Dc50 therebetween within the X-Y plane.

The size of the sensor c5 is defined by a length Lc5X along the first direction X and a length Lc5Y along the second direction Y. As the sensor a3 and the sensor c5 are compared to each other in size, the sensor c5 is formed into a rectangular shape of a size equivalent to that of the sensor a3.

The drive electrode Tc5 comprises a hole Hc5 in a central portion thereof, and has a constant width WTc5 over its entire body. The width WTc5 is greater than the width WLT3 of the drive wiring line LT3. The detection electrode Rc5 has a constant width WRc5 over its entire body. The width WRc5 is greater than the width WLRC5 of the detection wiring line LRC5. The width WTc5 of the drive electrode Tc5 is equivalent to the width WRc5 of the detection electrode Rc5. The width WLT3 of the drive wiring line LT3 is equivalent to the width WLRC5 of the detection wiring lines LRC5. The width WTc5 and the width WRc5 are greater than the gap Dc50.

The sensors c1 to c4 which constitute the bar portion C are configured to be similar to the sensor c5.

According to the configuration examples shown in FIGS. 6 to 8, the sensor a3, the sensor b4, and the sensor c5 are each configured so that the drive electrode is located on an inner side of the sensor and the detection electrode is located on an outer side, but the detection electrode may be located on the inner side and the drive electrode may be located on the outer side.

In the configuration examples shown in FIGS. 6 to 8, the electrode located on the inner side of the sensor is equivalent to a first electrode, and the electrode located on the outer side is equivalent to a connected to one of a detection wiring line and a drive wiring line, and the second electrode is connected to the other one of the detection wiring line and the drive wiring line.

Moreover, in the configuration examples shown in FIGS. 6 to 8, the drive electrodes are each formed into a rectangular shape with a hole made therein, but the hole may be omitted. Further, a light source may be provided on a rear side of the hole to illuminate from the rear side, a mark, an application name, an operation symbol or the like, provided to be superimposed on the hole.

Figure 9:
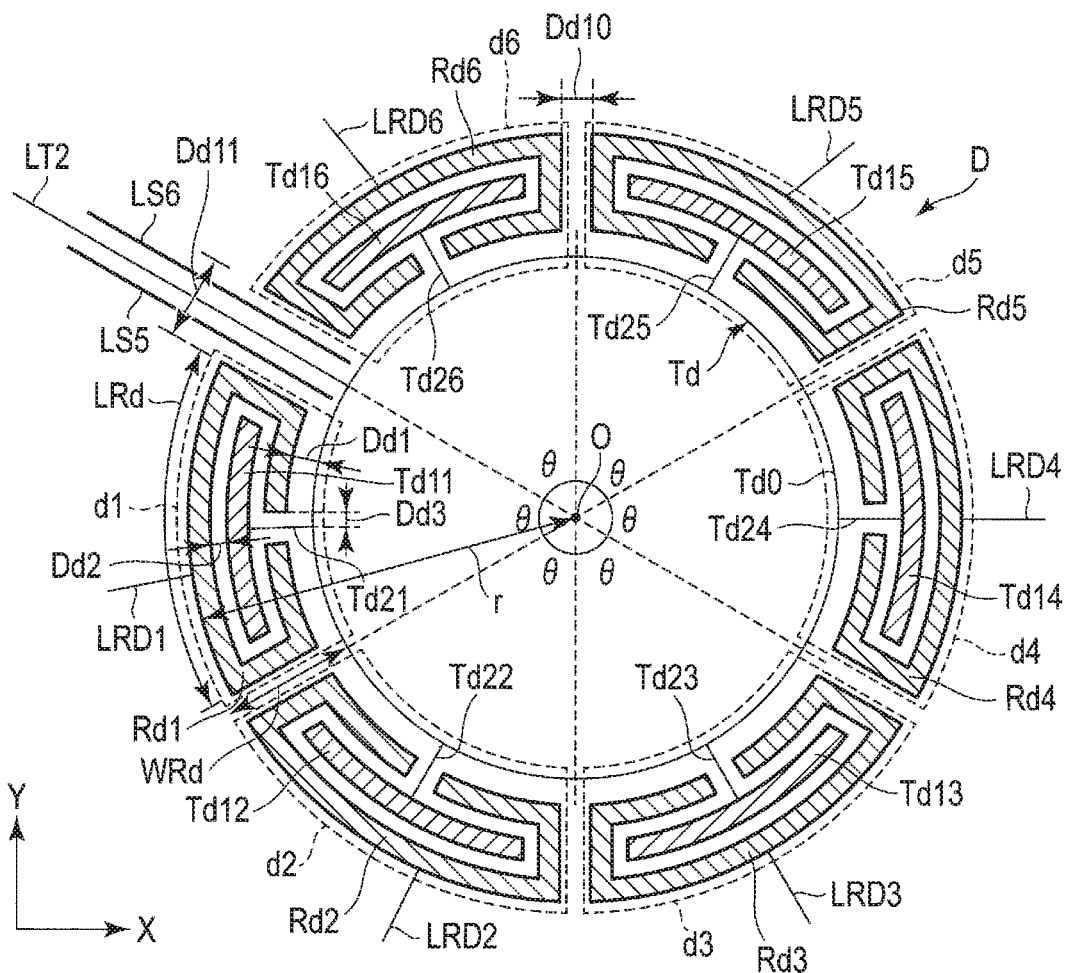
FIG. 9 is a plan view showing a configuration example of a volume portion D.

FIG. 9 is a plan view showing a configuration example of the volume portion D. In the volume portion D, the sensors d1 to d6 are located counter-clockwise in this order along a circumferential direction thereof. These sensors d1 to d6 are arranged in zones equally divided by a central angle θ. In the example illustrated, the central angle θ is about 60 degrees. Note that the volume portion D includes six sensors d1 to d6 in the example, but the number of sensors in the volume portion D is not limited to six.

The sensors d1 to d6 comprise a common drive electrode Td. The drive electrode Td is formed into an annular shape and connected to the drive wiring line LT2. A configuration example of the drive electrode Td will be described.

The drive electrode Td comprises an annular base Td0, drivers Td11 to Td16, located on an outer side of the base Td0 and connectors Td2l to Td26 which connect. the and base Td0 to the drivers Td11 to Td16, respectively. In the example illustrated, the base Td0 is formed into an annular shape, but may be polygonal such as hexagonal or ring-like such as elliptical. Further, the base Td0 is not limited to be annular, but may be radial from the vicinity of a center O. As long as connectable to all the sensors d1 to d6, the shape may not be a closed loop, but may be, for example, a letter "C" shape. The drivers Td11 to Td16 are provided in the sensors d1 to d6, respectively. The drivers Td11 to Td16 are arranged along the entire circumference of the base Td0 with gaps respectively between each adjacent pair. The drivers Td11 to Td16 are each formed into an arc shape. The connectors Td21 to Td26 are formed to radially extend from the base Td0, and are respectively connected to the drivers Td11 to Td16. Here, the number of the connectors Td21 to Td26 is equal to that of the drivers Td11 to Td16, but may be an integral multiple of the number of the drivers Td11 to Td16.

The sensors d1 to d6 comprise detection electrodes Rd1 to Rd6, respectively. The detection electrodes Rd1 to Rd6 are arranged along the entire circumference of the drive electrode Td with gaps respectively between each adjacent pair. The detection electrodes Rd1 to Rd6 are connected to the detection wiring lines LRD1 to LRD6, respectively. The detection wiring lines LRD1 to LRD6 each extend to an opposite side to the base Td0. The number of the detection electrodes Rd1 to Rd6 is equal to that of the drivers Td11 to Td16. The detection electrodes Rd1 to Rd6 surround the drivers Td11 to Td16, respectively.

The detection electrodes Rd1 to Rd6 oppose the drive electrode Td with a constant gap therebetween. When the detection electrode Rd1 is focused, the detection electrode Rd1 and the base Td0 oppose each other with a constant gap Dd1 therebetween within the X-Y plane. The detection electrode Rd1 and the driver Td11 oppose each other with a constant gap Dd2 therebetween within the X-Y plane. The detection electrode Rd1 and connector Td21 oppose each other with a constant gap Dd3 therebetween within the X-Y plane. The gaps Dd1 and Dd2 are substantially equal to each other and the gaps Dd3 is greater than or equal to the gap Dd1. The other detection electrodes Rd2 to Rd6 oppose the drive electrode Td as well as in the case of the detection electrode Rd1.

The size of the volume portion D is defined by a radius r. The size of the sensor d1 is defined by the width WRd along a diametrical direction and the length LRd along the circumferential direction. The other sensors d2 to d6 as well are similar in size to the sensor d1. For example, the radius r is 20 mm to 30 mm, the width WRd is 5 mm to 10 mm, and the length LRd is 20 mm to 30 mm.

The gap Dd11 of the adjacent pair of the sensors d1 and d6 is greater than the gap Dd1 of another adjacent pair of sensors. The gap between the sensors d1 and d2, the gap between the sensors d2 and d3, the gap between the sensors d3 and d4, the gap between the sensors d4 and d5, and the gap between the sensors d5 and d6 are equal to the gap Dd10.

The shield wiring lines LS5 and LS6 are located between the sensors d1 and d6 or between the adjacent pair of detection electrodes Rd1 and Rd6. The drive wiring line LT2 is located between the shield wiring lines LS5 and LS6 and is connected to the base Td0. That is, the shield wiring line LS5 is located. between the drive wiring line LT2 and the detection electrode Rd1, and the shield wiring line LS6 is located between the drive wiring line LT2 and the detection electrode Rd6.

In FIG. 9, the shield wiring line LS5 is equivalent to a first shield wiring line, and the shield wiring line LS6 is equivalent to a second shield wiring line.

Figure 10:
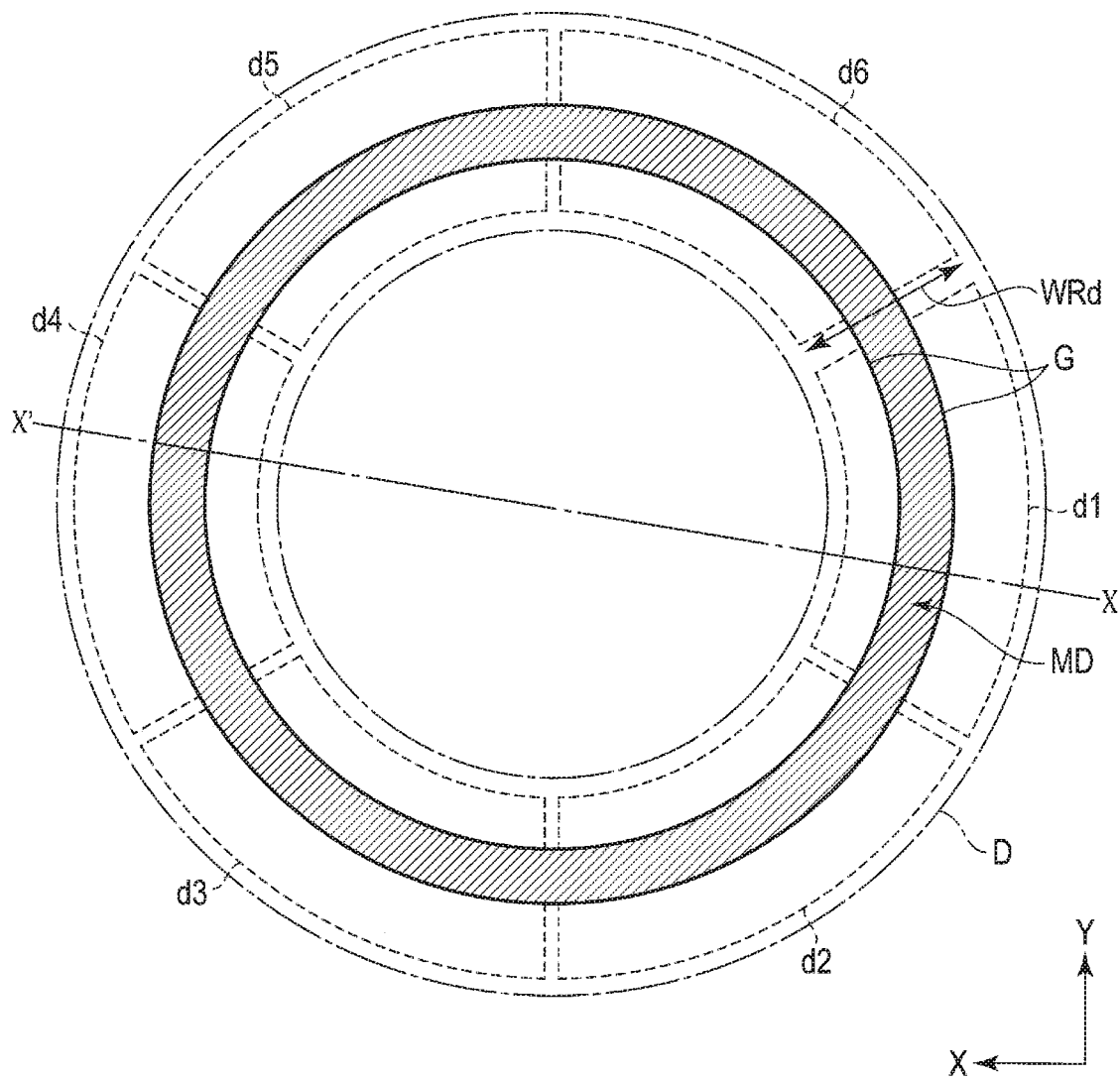
FIG. 10 is a plan view showing a configuration example of a groove portion G and a mark MD of the volume portion D.

FIG. 10 is a plan view showing a configuration example of a groove portion G and a mark MD of the volume portion D. In the X-Y plane, the groove portion G is superimposed on the volume portion D formed into a circular shape. The mark MD is superimposed on the groove portion G. In the example illustrated, the groove portion G and the mark MD have substantially the same width and substantially coincide with each other without displacing off from each other in plan view. However, one of the groove portion G and the mark MD may be formed wider than the other.

Moreover, the groove portion G and the mark MD are superimposed on the sensors d1 to d6. The width of the groove portion G and mark MD is equal to or less than the width WRd of the sensors d1 to d6. The groove portion G and mark MD should preferably be located substantially the center portions of the sensors d1 to d6.

Figure 11:
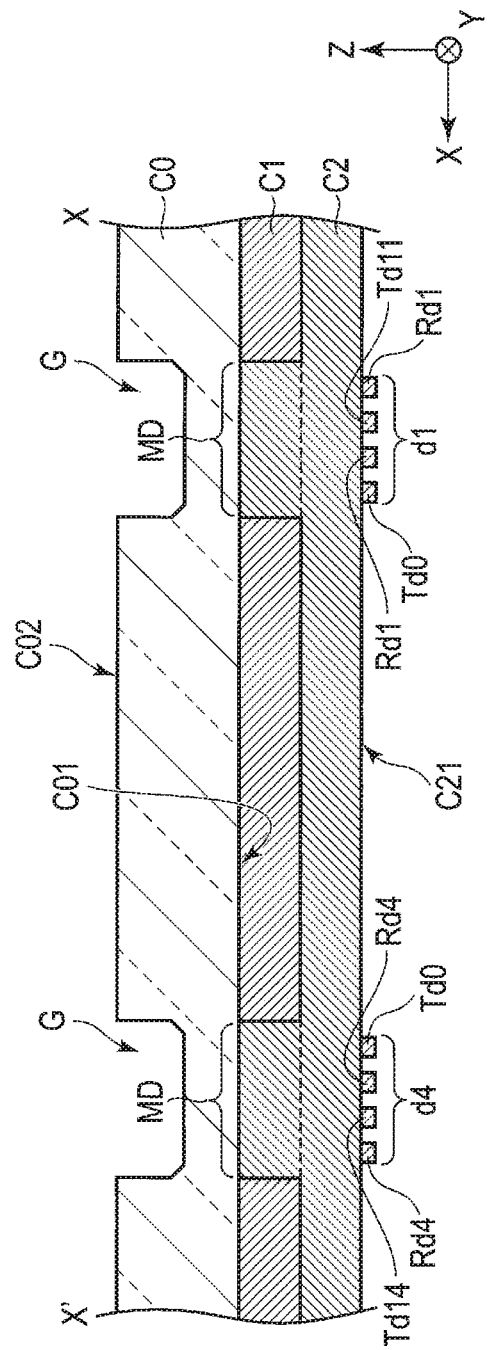
FIG. 11 is a cross section showing the structure of the volume portion D taken along line X-X' in FIG. 10.

FIG. 11 is a cross section showing the structure of the volume portion D taken along line X-X' shown in FIG. 10. The sensors d1 and d4 are located on a first. surface C01 side of the base material C0. The detection electrode and the drive electrode in each sensor are located on the same plane.

More specifically, the detection electrode Rd1 and the base Td0 and the driver Td11 of the drive electrode Td in the sensor d1 are provided on the lower surface C21 of the coloring layer C2. Similarly, the detection electrode Rd4 and the driver Td14 of the drive electrode Td in the sensor d4 are provided on the lower surface C21.

The groove portion G is formed in the second surface C02 of the base material C0 and is located right above the sensors d1 and d4. The mark MD is located between the base material C0 and the sensors d1 and d4 and directly under the groove portion G.

As described above, when a plurality of detection electrodes Rd1 to Rd6 oppose one annular drive electrode Td, a plurality of sensors d1 to d6 can be formed along a circumferential direction. Thus, a volume portion D comprising an annular sensor area can be realized.

Moreover, in each of the sensors d1 to d6, the detection electrode surrounds the driver, and therefore the electrostatic capacitance per sensor can be increased. Thus, a great number of sensors can be installed in a limited space without reducing the detection accuracy per one sensor.

Moreover, the base Td0 of the drive electrode Td is located on an inner side surrounded by the detection electrodes Rd1 to Rd6, and the detection wiring lines LRB1 to LRD6 extend to an opposite side to the base Td0. Therefore, as compared to the case where the drive electrode Td is located on an outer side of the detection electrodes Rd1 to Rd6, the number of wiring lines drawn outward from the inner side can be reduced. Consequently, the gap between each adjacent pair of detection electrode can be narrowed, thereby making it possible to continuously detect contacting of an object along the circumferential direction in the annular sensor area.

Moreover, the only wiring line drawn outwards from the inner side is the drive wiring line LT2, and further the shield wiring line LS5 is located between the drive wiring line LT2 and the detection electrode Rd1 and the shield wiring line LS6 is located between the drive wiring line LT2 and detection electrode Rd6. Therefore, the detection electrodes Rd1 and Rd6 are not easily affected by the electric field from the drive wiring line LT2, thereby making it possible to suppress detection errors and malfunction.

Further, a groove portion G is provided to be superimposed on the circular sensor area. With this structure, the position of the sensor area can be recognized by the user based on a change in the sense of touch felt.

Moreover, the mark MD is provided to be superimposed on the sensor area. With this structure, the position of the sensor area can be made visually recognizable for the user.

Next, a configuration example of the display panel PNL shown in FIG. 1 will be described.

Figure 12:
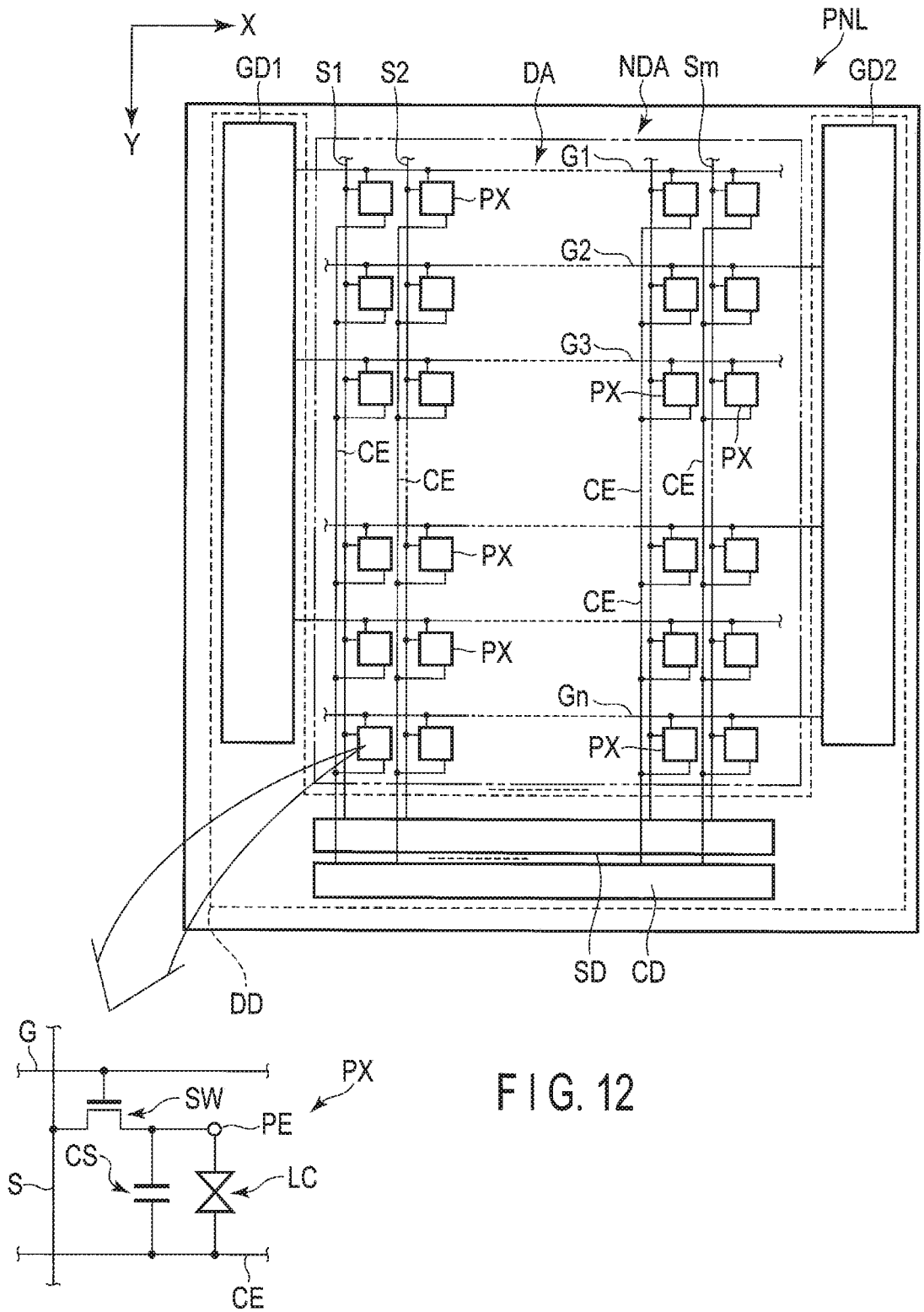
FIG. 12 is a diagram showing a basic structure and an equivalent circuit of a display panel PNL shown in FIG. 1.

FIG. 12 is a diagram showing a basic structure and an equivalent circuit of the display panel PNL shown in FIG. 1. The display panel PNL comprises a plurality of pixels PX, a plurality of scanning lines G (G1 to Gn), a plurality of signal lines S (S1 to Sm), a common electrode CE and the like in the display area DA. The pixels PX are arrayed in a matrix along the first direction X and the second direction Y. The scanning lines G each extend along the first direction X and are arranged along the second direction Y. The signal lines S each extend along the second direction Y and are arranged along the first direction X. The common electrode CE is disposed over the pixels PX.

The display driver DD includes a signal line driving circuit SD, scanning line driving circuits GD1 and GD2 and at least a part of the common electrode driving circuit CD. For example, odd-numbered scanning lines G are connected to the scanning line driving circuit GD1 and even-numbered scanning lines G are connected to the scanning line driving circuit GD2, but the structure is not limited to this example. The signal lines S are connected to the signal line drive circuit SD. The common electrode CE is connected to the common electrode drive circuit CD.

Each pixel PX comprises a switching element SW, a pixel electrode PE, the common electrode CE, the liquid crystal layer LC, and the like. The switching element SW is electrically connected to the respective scanning line G and the respective signal line S. The pixel electrode PE, is electrically connected to the switching element SW. The pixel electrode PE opposes the common electrode CE and drives the liquid crystal layer LC by the electric field produced between the pixel electrode PE and the common electrode CE. A storage capacitance CS is formed between, for example, the common electrode CE, and the pixel electrode PE.

Figure 13:
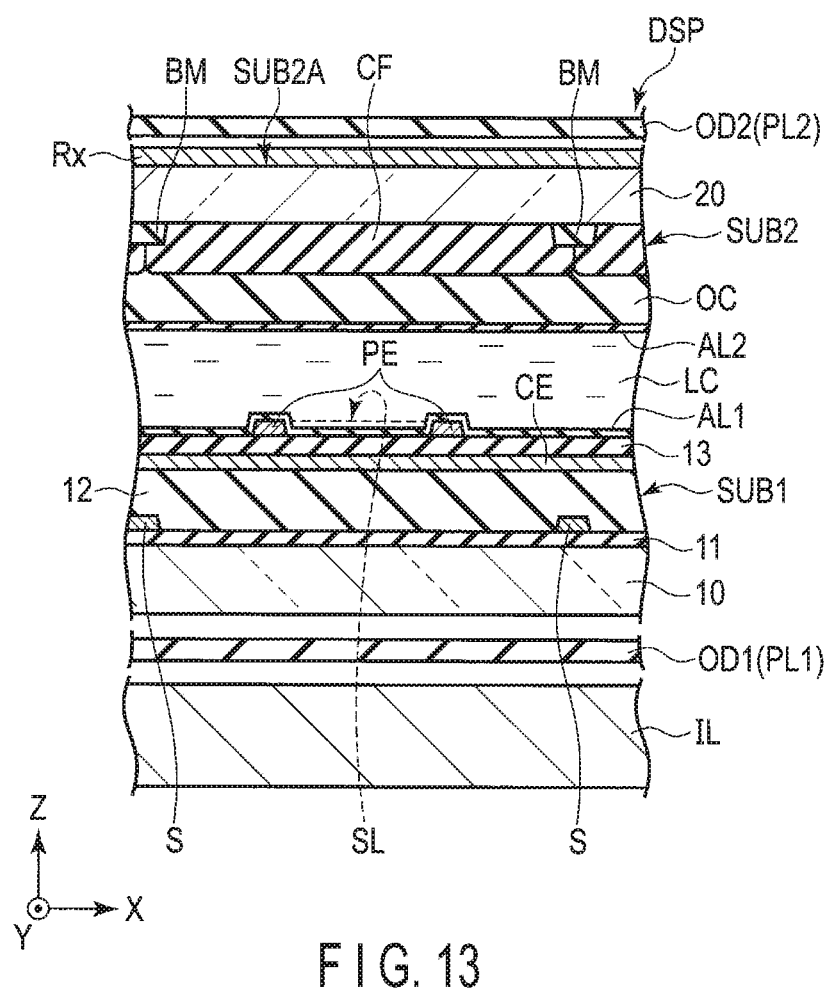
FIG. 13 is a cross-sectional view showing a structure of a part of the display panel PNL shown in FIG. 12.

FIG. 13 is a cross-sectional view showing the structure of a part of the display panel PNL shown in FIG. 12. The example shown is equivalent to a configuration example conforming to a display mode mainly using a lateral electric field substantially parallel to the main surface of the substrate. Note that the configuration is not limited to the example illustrated, but a configuration example corresponding to the display mode which utilizes the electric field vertical to the main surface of the substrate, or the electric field oblique to the main surface of the substrate or the electric field of combination of these, may be applied. Here, the main surface of the substrate is a plane parallel to the X-Y plane defined by the first direction X and the second direction Y.

The first substrate SUB1 comprises a first insulating substrate 10, signal lines S, a common electrode CE, pixel electrodes PE, a first insulating film 11, a second insulating film 12, a third insulating film 13, a first alignment film AL1 and the like. It should be noted that the switching elements, scanning lines, various insulating films interposed therebetween and the like are not illustrated in the drawing. The first insulating substrate 10 is a light transmissive substrate such as a glass substrate or a resin substrate.

The second substrate SUB2 comprises a second insulating substrate 20, light shielding layers BM, a color filter CF, an overcoat layer OC, a second alignment film AL2 and the like. Note that the color filter CF may be disposed on the first substrate SUB1.

The liquid crystal layer LC is located between the first substrate SUB1 and the second substrate SUB2, and is held between the first alignment film AL1 and the second alignment film AL2.

The detection electrodes Rx which constitute the sensor device 200 are located on the second upper surface SUB2A of the second substrate SUB2.

A first optical element OD1 including a first polarizer PL1 is located between the first insulating substrate 10 and the illumination device BL. A second optical element OD2 including a second polarizer PL2 is located on the detection electrode Rx.

Next, a configuration example of the sensor device 200 will be explained.

Figure 14:
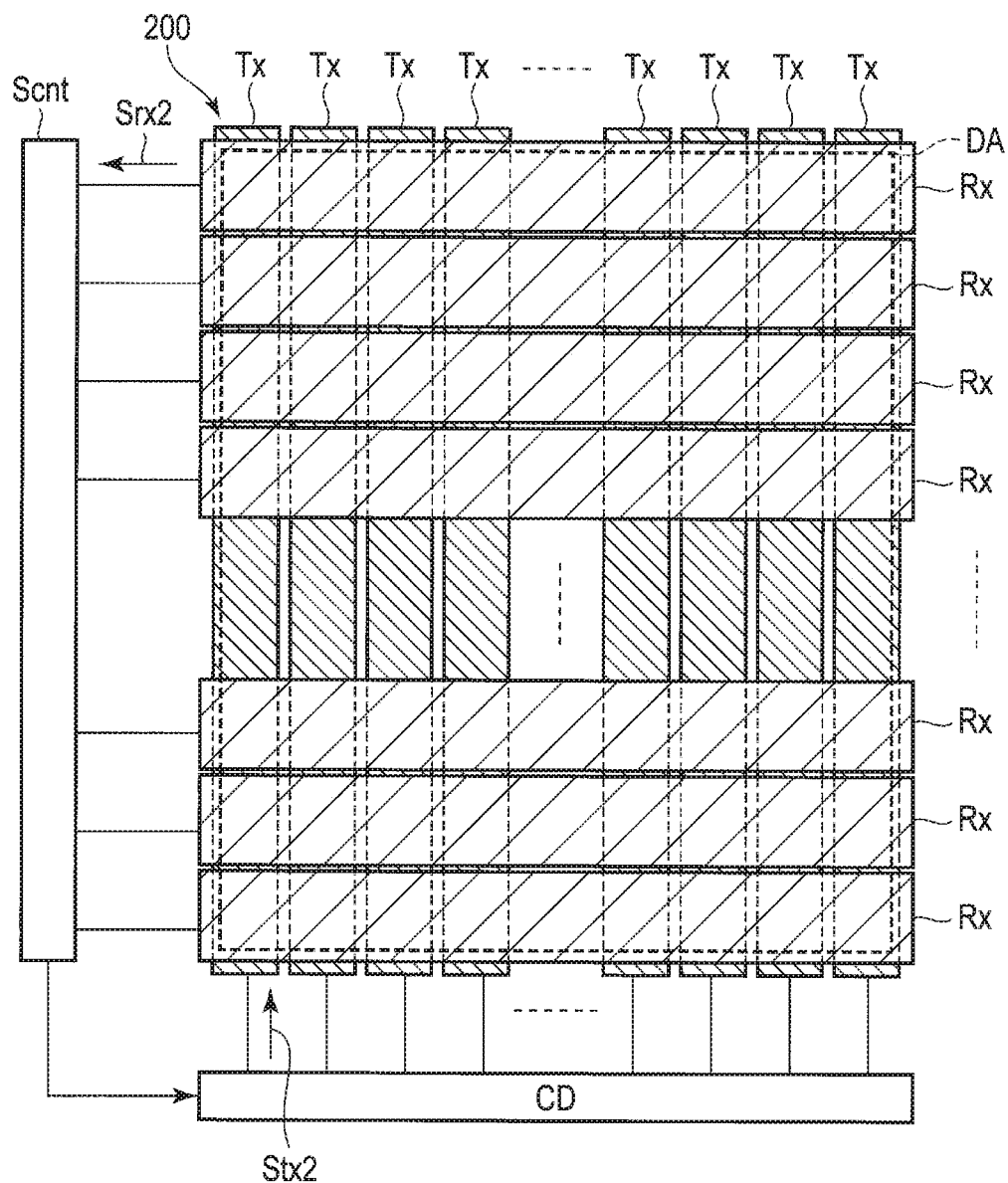
FIG. 14 is a diagram showing a configuration example of the sensor device 200.

FIG. 14 is a plan view showing a configuration example of the sensor device 200. The sensor device 200 comprises drive electrodes Tx and detection electrodes Rx. The drive electrodes Tx are formed by the common electrode CE shown in FIG. 13. The detection electrodes Rx are located on a second upper surface SUB2A of the second substrate SUB2 as shown in FIG. 13. The drive electrodes Tx and the detection electrodes Rx are formed from, for example, a metal material, a transparent oxide material such as ITO or IZO, a conductive organic material, a fine dispersive of a conductive substance. The drive electrodes Tx and the detection electrodes Rx may be of a single layer structure or a multilayered structure in which a plurality of thin films are stacked one on another. The shape of each of the drive electrodes Tx and the detection electrodes Rx is, for example, strip-like, wavy, grid, mesh or the like. In the example illustrated, the sensor driving electrodes Tx and the detection electrodes Rx cross each other in plan view.

The common electrode driving circuit CD supplies a common drive signal to the common electrode CE during a display period in which images are displayed on the display panel PNL. On the other hand, video signals are supplied to the pixel electrodes PE. Thus, a potential difference is produced between the common electrode CE and each pixel electrode PE, and an electric field is applied to the liquid crystal layer LC. The alignment state of the liquid crystal molecules of the liquid crystal layer LC is controlled based on the electric field applied.

The display device DSP has a sensor period for detecting contacting or approaching of an object after the display period. The sensor controller Scnt controls the common electrode driving circuit CD in a sensor period. The common electrode driving circuit CD supplies a sensor drive signal Stx2 to the target common electrode CE. Thus, the common electrode CE, to which the sensor drive signal Stx2 is supplied, functions as the drive electrodes Tx. The drive electrodes Tx produce capacitance between the drive electrodes Tx and the detection electrodes Rx. The detection electrodes Rx output sensor signals (based on the change in capacitance between a drive electrode Tx and a detection electrode Rx) Srx2 necessary for sensing, when the sensor drive signals Stx2 are supplied to the drive electrodes Tx. The sensor controller Scnt reads the sensor signals Srx2 from the detection electrodes Rx and detects whether an object contacts or approaches the display device DSP or further detects a position coordinate of the object, etc.

Note the various sensors included in the above-described sensor devices 100 and 200 are not limited to a mutual-capacitive type, but may be of a self-capacitive type.

According to the embodiments, as described above, a display device with an improved operability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Examples of the display device which can be obtained from the configurations described in this specification will be hereinafter provided.

(1) A display device comprising:
a display panel;
a cover member comprising an opening which opposes the display panel; and
a sensor device provided around the opening in the cover member,
the sensor device comprising:
a button portion comprising a plurality of first sensors arranged at a first interval along a first direction;
a bar portion comprising plurality of second sensors arranged at a second interval along the first direction, the second sensors being smaller than the first sensors; and
a volume portion formed into a ring shape and comprising a plurality of third sensors arranged along a circumferential direction thereof.

(2) The display device of item (1), wherein the sensor device further comprises a first drive wiring line respectively connected to the plurality of first sensors, a second drive wiring line respectively connected to the plurality of second sensors, and a third drive wiring line respectively connected to the plurality of third sensors, and the first to third drive wiring lines are located between the button portion and the bar portion.

(3) The display device of item (2), wherein the sensor device further comprises a first shield wiring line and a second shield wiring line, the first shield wiring line and the second shield wiring line are at ground potential, and the first to third drive wiring lines are located between the first shield wiring line and the second shield wiring line.

(4) The display device of item (3), wherein the sensor device further comprises first detection wiring lines respectively connected to the first sensors, second detection wiring lines respectively connected to the second sensors, and third detection wiring lines respectively connected to the third sensors, the first shield wiring line is located between the first detection wiring lines and the first to third drive wiring lines, and the second shield wiring lines is located between the second and third detection wiring lines and the first to third drive wiring lines.

(5) The display device of item (4), wherein the first to third drive wiring lines, the first to third detection wiring lines, and the first to second shield wiring lines are all located on a same plane.

(6) The display device of item (4) or (5), wherein the first to third drive wiring lines, the first to third detection wiring lines, and the first to second shield wiring lines are all formed from an identical material.

(7) The display device of one of items (4) to (6), wherein the first to third drive wiring lines, the first to third detection wiring lines, and the first to second shield wiring lines are not located in the opening.

(8) The display device of one of items (1) to (7), wherein the second interval is less than the first interval.

(9) A display device comprising:

a display panel;

a cover member comprising an opening which opposes the display panel;

a first sensor device provide around the opening in the cover member; and a second sensor device provided in the display panel and superimposed on the opening, the first sensor device comprising a shield wiring line at a ground potential, provided along the opening.

(10) The display device of item (9), wherein the first sensor device comprises:

a sensor;

a detection wiring line located between the shield wiring line and the sensor and connected to the sensor; and a drive wiring line connected to the sensor, and the sensor is located between the detection wiring line and the drive wiring line.

(11) The display device of item (9), wherein the sensor comprises:

a first electrode; and a second electrode located on an outer side to the first electrode, surrounding the first electrode, and comprising one end portion and another end portion opposing each other with a gap therebetween, the first electrode is connected to one of the detection wiring line and the drive wiring line passing through between the one end portion and the other end portion, and the second electrode is connected to the other wiring line of the detection wiring line and the drive wiring line.

(12) The display device of item (11), wherein the first electrode comprises a hole in a central portion thereof, the first electrode has a line width greater than that of the one of the wiring lines, and the second electrode has a line width greater than that of the other one of the wiring lines.

(13) A sensor device comprising:

a base material comprising a first surface and a second surface on an opposite side to the first surface, a volume portion located on a side of the first surface, formed into a ring-like shape and comprising a plurality of sensors arranged along a circumferential direction thereof, and the base material comprises a groove portion superimposed on the plurality of sensors in the second surface.

(14) The sensor device of item (13), further comprising a mark located between the base material and the plurality of sensors and superimposed on the groove portion.

(15) The sensor device of item (13) or (14), wherein the sensor comprises:

a drive electrode comprising an annular base, a driver located on an outer side of the base, and a connector which connects the base and the driver; and a detection electrode which surrounds the driver.

(16) The sensor device of one of items (13) to (15), further comprising:

a first shield wiring line and a second shield wiring line located between each respective adjacent. pair of the sensors; and a drive wiring line connected to the base, wherein the first shield wiring line and the second shield wiring line are at ground potential, and the drive wiring line is located between the first shield wiring line and the second shield wiring line.

(17) A sensor device comprising:

an annular drive electrode; and a plurality of detection electrodes located on an outer side of the drive electrode on a same plane as that of the drive electrode, and arranged at intervals along an entire circumference of the drive electrode, wherein the sensor detects contacting or approaching of an object in a circular sensor area based on electrostatic capacitance between the drive electrode and the plurality of detection electrodes.

(18) The sensor device of item (17), wherein the drive electrode further comprises:

an annular base;

a driver located on an outer side of the base and opposing one of the plurality of detection electrodes; and a connector which connects the base and the driver to each other, and the detection electrode surrounds the driver.

(19) The sensor device of item (17) or (18), further comprising:
a first shield wiring line and a second shield wiring line located between each adjacent pair of the plurality of detection electrodes; and
a drive wiring line connected to the base,
wherein
the first shield wiring line and the second shield wiring line are at ground potential, and
the drive wiring line is located between the first shield wiring line and the second shield wiring line.

(20) The sensor device of one of items (17) to (19), further comprising:
a base material comprising a first surface opposing the sensors containing the drive electrode and the detection electrode, and a second surface on an opposite side to the first surface, and
the base material comprises a groove portion superimposed on the sensor in the second surface.

(21) The sensor device of item (20), further comprising:
a mark located between the base material and the sensors and superimposed on the groove portion.

(22) A display device comprising:
a cover member comprising an opening;
a wiring board;
a display panel located between the cover member and the wiring board and opposing the opening;
a first sensor device provided around the opening in the cover member;
a second sensor device provided on the display panel;
a first flexible wiring board which electrically connects the first sensor device and the wiring board to each other;
a second flexible wiring board which electrically connects the second sensor device and the wiring board to each other; and
a sensor controller provided on the wiring board, which controls the first sensor device and the second sensor device.

(23) The display device of item (22), wherein
the wiring board comprises a first connector and a second connector,
the first flexible wiring board extends along a first direction, and is bent by a first bend line along a second direction crossing the first direction, and connected to the first connector, and
the second flexible wiring board extends along the second direction, and is bent by a second bending line along the first direction, and connected to the second connector.

What is claimed is:

1. An electronic device, comprising:
a cover member comprising an opening;
a first sensor device provided around the opening in the cover member;
a second sensor device superimposed on the opening;
a first drive wiring line;
a plurality of first sensors located in a first area, each connected to the first drive wiring line, and belonging to a first group;
a plurality of first detection wiring lines connected to the first sensors in one-to-one correspondence;
a plurality of second sensors located in a second area, each connected to the first drive wiring line, and belonging to a second group; and
a plurality of second detection wiring lines connected to the second sensors in one-to-one correspondence,
wherein the first sensor device comprises
a shield wiring line at a ground potential;
a third sensor;
a third detection wiring line connected to the third sensor; and
a second drive wiring line connected to the third sensor,
the third sensor is located between the third detection wiring line and the second drive wiring line,
the shield wiring line is located between the third detection wiring line and the second drive wiring line,
the third detection wiring line transmits a detection signal,
the second drive wiring line transmits a drive signal,
the detection signal is a different signal from the drive signal, and
the second area is located away from the first area.

2. The device of claim 1, wherein the third sensor comprises:
a first electrode; and
a second electrode located on an outer side to the first electrode, surrounding the first electrode, and comprising one end portion and another end portion opposing each other with a gap therebetween,
the first electrode is connected to one of the third detection wiring line and the second drive wiring line passing through between the one end portion and the other end portion, and
the second electrode is connected to the other wiring line of the third detection wiring line and the second drive wiring line.

3. The device of claim 2, wherein
the first electrode comprises a hole in a central portion thereof,
the first electrode has a line width greater than that of the one of the third detection wiring line and the second drive wiring line, and
the second electrode has a line width greater than that of the other one of the third detection wiring line and the second drive wiring line.

4. The device of claim 1, further comprising:
a wiring board;
a first flexible wiring board which electrically connects the first sensor device and the wiring board to each other;
a second flexible wiring board which electrically connects the second sensor device and the wiring board to each other; and
a sensor controller, provided on the wiring board, and which controls the first sensor device and the second sensor device.

5. The device of claim 4, wherein
the wiring board comprises a first connector and a second connector,
the first flexible wiring board extends along a first direction, and is bent by a first bending line along a second direction crossing the first direction and connected to the first connector, and
the second flexible wiring board extends along the second direction, and is bent by a second bending line along the first direction and connected to the second connector.

* * * * *